United States Patent
Poulsen et al.

(10) Patent No.: US 6,298,139 B1
(45) Date of Patent: Oct. 2, 2001

(54) APPARATUS AND METHOD FOR MAINTAINING A CONSTANT SPEECH ENVELOPE USING VARIABLE COEFFICIENT AUTOMATIC GAIN CONTROL

(75) Inventors: Steven P. Poulsen; James P. Preston, II, both of Lincoln, NE (US)

(73) Assignee: Transcrypt International, Inc., Lincoln, NE (US)

( * ) Notice: Subject to any disclaimer, the term of this patent is extended or adjusted under 35 U.S.C. 154(b) by 0 days.

(21) Appl. No.: 09/002,182

(22) Filed: Dec. 31, 1997

(51) Int. Cl.$^7$ ............................................ H03G 3/00
(52) U.S. Cl. ........................ 381/107; 381/104; 381/102
(58) Field of Search ..................................... 381/107, 108, 381/320, 321, 102, 104, 109, 57, 106

(56) References Cited

U.S. PATENT DOCUMENTS

| | | |
|---|---|---|
| 4,112,384 | 9/1978 | Buchberger . |
| 4,403,348 | 9/1983 | Leland et al. . |
| 4,455,676 | 6/1984 | Kaneda . |
| 4,677,389 * | 6/1987 | Op De Beek et al. .............. 330/129 |
| 5,146,504 | 9/1992 | Pinckley . |
| 5,165,017 * | 11/1992 | Eddington et al. ................. 381/68.4 |
| 5,261,007 | 11/1993 | Hirsch . |
| 5,349,699 * | 9/1994 | Erben et al. ....................... 455/186.1 |
| 5,394,476 | 2/1995 | Rollins et al. . |
| 5,404,315 * | 4/1995 | Nakano et al. ....................... 364/514 |
| 5,432,862 | 7/1995 | Hirsch . |
| 5,434,922 * | 7/1995 | Miller et al. ............................. 381/57 |
| 5,553,151 * | 9/1996 | Goldberg ............................ 381/68.4 |
| 5,596,651 | 1/1997 | Yamaguchi . |
| 5,615,256 | 3/1997 | Yamashita . |
| 5,687,241 * | 11/1997 | Ludvigsen ........................... 381/68.4 |
| 5,699,424 * | 12/1997 | Hirano ................................. 379/410 |
| 5,832,444 * | 11/1998 | Schmidt ............................... 704/500 |
| 5,854,845 * | 12/1998 | Itani .................................... 381/108 |

* cited by examiner

Primary Examiner—Xu Mei
(74) Attorney, Agent, or Firm—Zarley, McKee, Thomte, Voorhes & Sease

(57) ABSTRACT

An apparatus and method for maintaining a constant speech envelope using automatic gain control, wherein the level of the audio signal is monitored. If increasing, a first level of gain increase is applied to the gain signal. If decreasing, a second level of gain decrease is applied to the gain signal, the second level being less than the first level. By applying a lower level of change to the gain signal when it is seen as decreasing, a more constant speech envelope is obtained during gaps and interstices in the analog signal that are common in speech.

12 Claims, 3 Drawing Sheets

APPARATUS AND METHOD FOR MAINTAINING A CONSTANT SPEECH ENVELOPE USING VARIABLE COEFFICIENT AUTOMATIC GAIN CONTROL

BACKGROUND OF THE INVENTION

1. Field of the Invention

The present invention relates to controlling the amount of gain applied to an audio speech signal, and in particular, to maintaining a constant speech envelop by control of the gain.

2. Background of the Art

When processing audio samples, it is often desirable to have the samples at a fixed amplitude. The reason for this is that many such audio processing methods or algorithms are typically optimized for a given level, as is well known in the art. For example, too little gain runs the risk that noise will disturb accurate processing results. Too much gain risks over creating too big a signal. Clipping or other detrimental results can occur.

When processing speech, for example, there is normally a stable level. But in radio communications, for example, if speech is transmitted and the volume of the receiver is turned up, then there can be problems that could disrupt audio processing of the received signal. Therefore, it is many times desirable to keep a constant level for as much of the time speech is present and is to be processed.

Automatic gain control (AGC) has long been used as a method of controlling gain. Some sort of feedback is utilized to compare the current level of a signal with prior levels, or the current levels could be compared to some predetermined level. The circuitry would automatically adjust gain based on that type of monitoring.

AGC methods have been applied to audio envelopes, including the attempt to maintain a fixed level. For example, some current AGC methods are able to adjust the audio to a fixed level by using a rapidly changing gain control. The gain adjusts rapidly whenever the input envelope changes regardless of whether the envelope is increasing or decreasing. These methods work well for data input where the envelope is fairly constant. However, speech tends to have many gaps ranging from very small (those between syllables) to large (those between sentences). Thus, the envelope changes often. Thus, methods exist to detect if a level that is rising is probably speech (as opposed to non-speech or noise). However, there are not good methods to predict if a decrease in level is still speech or whether speech has ended. If the gain is improvidently raised or lowered, then the risk is that background noise will be counter-productive to audio processing. The need for a constant level exists so that the audio processor has the best information about the actual speech or audio.

Therefore, the state of the art attempts to use AGC to rapidly adjust gain up or down depending on the input signal. Consequently, the speech envelope can change up or down by the speech envelope changing over the course of significant speech content (i.e. during the speaking of a sentence). However, using known AGC methods, gain would quickly adjust upwardly when the sentence is started and maintain a constant speech envelope during a syllable. But at the end of a syllable it would likewise start to adjust quickly downward. At the beginning of the next syllable it would adjust quickly up and so on. The speech envelope would likewise increase and decrease rapidly and may not be very constant. Therefore, the goal of the constant speech envelope would be difficult to maintain. The conventional prior art methods determine the level of the audio from a recent sample of audio and compare the recent sample level with a mean of prior sampled levels. Any adjustment in gain is weighted towards a mean value of past samples of the audio signal to avoid quick, directly corresponding changes in gain relative to the signal. For example, some existing methods weight any adjustment in gain 0.9 towards a mean of past samples of the audio versus 0.1 towards a recent sample. This weighting is the same, however, whether gain is adjusted when the signal level is determined to be increasing as well as when it is determined to be decreasing.

Because of the benefits of a constant speech envelope for certain audio processing methods, there is a real need in the art to improve upon the state of the art with regard to the use of AGC methods with audio sample to maintain a fixed speech envelope.

Some prior art AGC methods specify the amount of gain increase or decrease that should take place during AGC. The absolute value of the input signal level is obtained. A mean of prior actual samples is also maintained. Then, the current actual sample is compared to the mean. It is assumed that if the current sample is greater than the mean, that the signal amplitude is increasing. Conversely, if the current sample is less than the mean, it is assumed that the signal level is decreasing.

A pair of coefficients are predetermined. One coefficient essentially controls the amount of decrease of gain applied to the current audio sample if the level of the audio is increasing. The other coefficient determines the amount of increase of gain applied to the current sample if the level of the signal is decreasing. Thus, a single pair of coefficients are fixed over the processing of the speech and generally result in an increase or decrease in gain of the same amount or rate.

It is therefore a principle object of the present invention to provide an apparatus and method for maintaining a constant speech envelope using automatic gain control which improves over or solves the problems of deficiencies in the art.

Further objects of the present invention are to provide an apparatus and method as previously described which:

A. differs with respect to the amount of gain applied when an input signal is increasing versus the amount or the gain applied when the input signal is decreasing.

B. weights the amount of gain applied to an increasing signal more favorably to the level of the current input to achieve a relatively slow and beneficial upward adjustment when the signal is increasing.

C. weights more heavily the applied gain relative to a mean of past input signals when the input signal is decreasing than if the signal were increasing to achieve a slower and thus more beneficial downward adjustment when the signal is decreasing.

D. maintains a relatively constant speech envelope during speech.

E. effectively maintains a fairly constant gain even in between syllables or words of speech.

F. more quickly raises gain when speech occurs after a relatively long period of no speech, but more slowly decreases gain even if it is indicated that the signal level is falling so that gaps between syllables or sentences in speech are not handled as if speech has stopped.

G. is accurate, relatively economical, and durable.

These and other objects, features, and advantages of the present invention will become more apparent with reference to the accompanying specification and claims.

SUMMARY OF THE INVENTION

The present invention comprises an apparatus and method for maintaining a constant speech envelope when using automatic gain control.

The method includes monitoring the actual audio signal amplitude. If increasing, a gain increase of a first amount is applied to the gain signal. The gain signal is the inverse of the mean of prior samples of the signal. If decreasing, a gain of a second amount is applied to the audio signal. The first amount is greater than the second amount of gain. In one option, the invention weights the gain increase of the first amount more heavily towards the level of the most recent part of the audio signal than prior art methods, but on the other hand weights the gain decrease of the second level more heavily towards a mean of past actual audio levels. By doing so, the method allows increase in gain upon an increasing audio signal to bring the speech envelope up to a constant level at the beginning of a portion of speech, but on the other hand causes slower decreases in gain if the level of speech decreases. The method thus creates a more constant speech envelope during speech, which sometimes can include short gaps between syllables and words, and avoids a more non-constant speech envelope if gain were allowed to increase and decrease rapidly with increasing and decreasing speech levels respectively.

The apparatus according to the invention includes an input for a current sample of audio and an output for an adjusted sample. Between the input and output is a component which provides a ratio of the input sample to a dynamically adjusted mean. The ratio determines how much the input sample is adjusted in gain. This is accomplished by the changing mean. The changing mean is generated by a component which has an input for the absolute value of the current sample and an output from a storage buffer that contains successively updated values of the mean. A pair of switches are between the sample input and an adder and between a feedback of the current mean from the buffer and the adder respectively. The first switch has two inputs, one comprising the value of the sample amplified by the quantity $1-K_1$. The second input is the sample value amplified by the value $1-K_2$. The second switch has two inputs; the first being the fed-back mean amplified by the value $K_1$, the second being the fed-back mean amplified by the value $K_2$. A switch control unit compares the absolute value of the sample with the fed-back mean value prior to amplification. The comparator sends a signal to the first and second switches which passes the input sample absolute value amplified by $1-K_1$ to the adder and the fed-back mean amplified by $K_1$ to the adder if the input sample is less than the mean in the buffer. On the other hand, the input sample absolute value amplified by $1-K_2$ and the fed-back mean amplified by $K_2$ are sent through the switches to the adder if the input sample exceeds the fed-back mean. The value of $K_1$ exceeds the value of $K_2$. Therefore, if the sample is greater than the mean, the next mean is weighted more heavily with respect to value of the current sample than the other case. If the sample is less than the mean, the next mean is weighted more heavily to prior samples than the previous case.

DETAILED DESCRIPTION OF THE PREFERRED EMBODIMENT

Figure 3A:
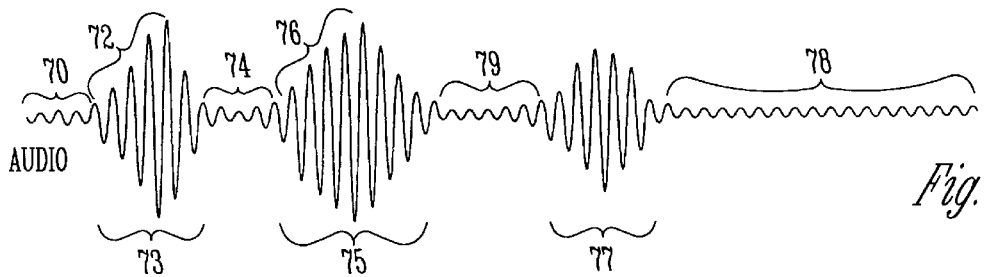
FIG. 3A a diagrammatic simplified depiction of an analog audio signal showing exemplary variations in the level of the audio signal during speech, but not showing all detail of a speech signal.

The present invention will now be described in detail with respect to a preferred embodiment of the same. The context of this detailed description will be with respect to an audio signal (diagrammatically depicted, in simplified form, at FIG. 3A) which is sampled at a rate of 8000 samples per second, the samples allowing derivation of amplitude or level of the audio signal at each sample time, such as is well known in the art. As is appreciated by those skilled in the art, FIG. 3A is only representing the general amplitude envelope for an example of speech. The complex specific frequency content of speech along the signal is not represented as it is not needed for an understanding of the invention.

The preferred embodiment operates to adjust the level of each sample based on the manipulation of that level, as will be described below. This effectively creates an automatic gain control for the audio signal by the manipulation of the samples.

In this detailed description, reference will be made to the. Reference numerals will be used to indicate parts or locations in the drawings. The same reference numerals will be used to indicate the same parts or locations throughout the drawings unless otherwise indicated.

Figure 1:
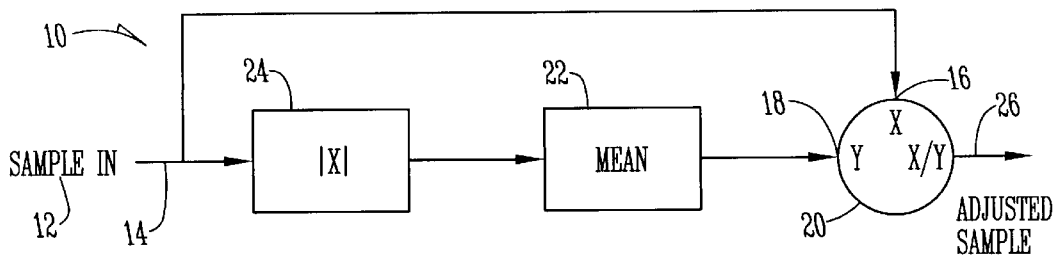
FIG. 1 is a block diagram of an AGC circuit according to the present invention.

FIG. 1 illustrates the general circuit or functions according to the preferred embodiment of the invention. The circuit of FIG. 1 will be generally referred to as variable coefficient automatic gain control (AGC) circuit 10. Audio samples 12 are introduced successively at input 14 to circuit 10. Each sample, here referred to as "X", is sent to an input 16 of divider component 20. The other input 18 is the current generated mean value "Y" from mean generator 22. Mean generator takes the absolute value |X| of the input sample 12 (see component 24) and uses those absolute values to calculate a mean that ends up at input 18 to divider 20. The quotient or ratio of X/Y is then output at 26 and is used as a factor for either adding or subtracting to the level of the input sample 12 to create the adjusted output sample 28.

By this circuit 10, the level or gain of each sample 12 is thus continuous and dynamically adjusted by circuit 10 and the adjusted sample 28 essentially is automatically gain controlled according to the invention. The adjustments to samples 12 create a relatively constant speech envelope, given different levels of input audio.

Figure 2:
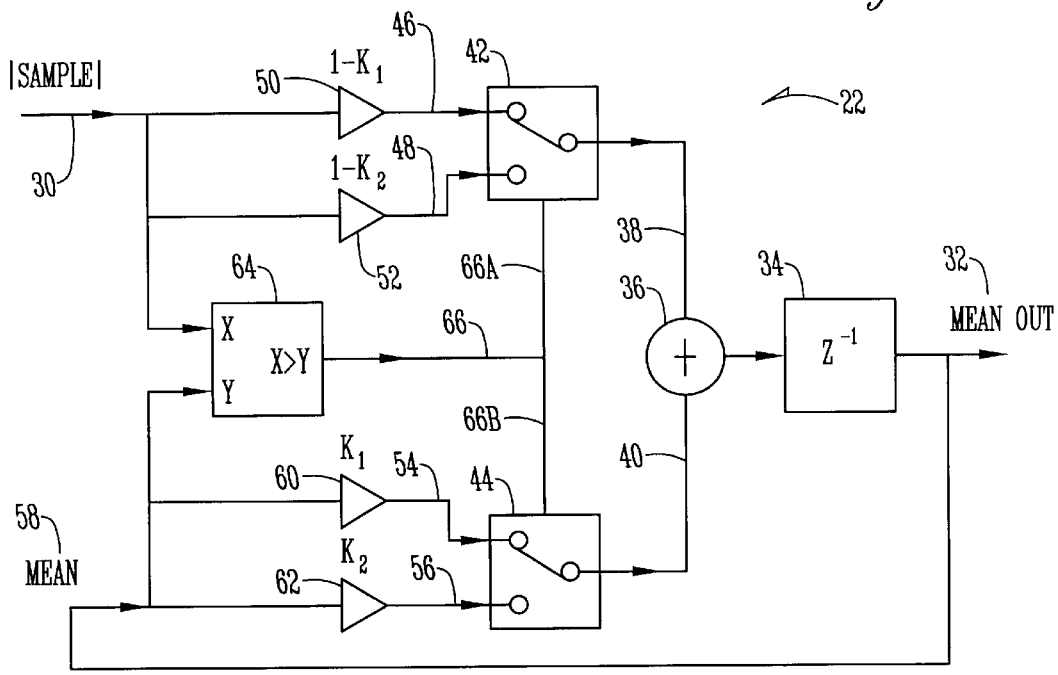
FIG. 2 is a block diagram of the mean generator (box 22) of FIG. 1.

FIG. 2 illustrates the circuitry of mean generator 22. As stated previously, the input (see reference number 30) to mean generator 22 is the absolute value of the input sample 12. The output 32 of mean generator 22 will be entitled the "mean out". This mean out 32 is what is placed at input 18 of divider 20 for each sample 12. As can be seen at FIG. 2, mean out 32 is created by a continual clocking of buffer 34. The value $z^{-1}$ indicates that the output of buffer 34 is the output of adder 36 delayed one sample period. The input to buffer 34 is the output of adder 36. The inputs to adder 36 (38, 40) are the outputs of switches 42 and 44.

On the other hand, the inputs 46 and 48 to switch 42 are the absolute value of the current sample as amplified by amplifier 50 and amplifier 52 respectively. The inputs to switch 44 (54 and 56) are the fed-back mean 58 from buffer 34 amplified by amplifier 60 and amplifier 62 respectively.

It can further been seen from FIG. 2 that a switch controller 64 has as inputs the absolute value of sample 30 ("X") and the fed-back mean 58("Y"). Control 64 allows switches 42 and 44 to remain in the default position shown in FIG. 2 unless X is greater than Y. If so, a signal is sent down lines 66 and 66A and 66B to switches 42 and 44 to turn the switches "on", which means the switches pass the amplified signals at inputs 48 and 56. Thus, in the default position, switches 42 and 44 cause the sample absolute value scaled by the value $1-K_1$, and the fed-back mean scaled by the value $K_1$, to be added together and put into buffer 34 as the next mean out 32. On the other hand, if X is greater than Y, i.e. the absolute value of the sample exceeds the value of the mean, switches 42 and 44 pass the absolute value of the sample as scaled by the value $1-K_2$, and the fed-back mean is scaled by the value $K_2$ to adder 36, which sum is then placed into buffer 34 as the next mean-out. It is to be understood that the values $K_1$ and $K_2$ are two coefficients. The values $K_1$ and $K_2$, according to the preferred embodiment of the invention, are usually less than the value 1, but much greater than the value 0.5. Therefore, when switches 42 and 44 are in the default state, the pair of coefficients ($1-K_1$ and $K_1$) are utilized to provide the mean-out signal 32 which would then control how much adjustment to the current sample is made; in other words how much gain is applied to the signal at that particular sample. Similarly, if the switches 32 and 34 are in the "on" state, the pair of coefficients ($1-K_2$ and $K_2$) operate on the absolute value of the sample and on the mean that is fed back, respectively, to generate the mean-out signal 32 which would then control the gain of the current sample. Thus, there are two pairs of coefficients that are used with the invention. One pair is used when it is assumed that the audio signal level is increasing [($1-K_2$) and $K_2$], and one pair when it is assumed the signal level is decreasing [($1-K_1$) and $K_2$]. The value of $K_1$ is preferred to be higher than $K_2$. Normally, both $K_1$ and $K_2$ will be a value somewhere between 0.5 and 1. As can be seen by comparing the two sets of coefficients and how they operate on the two values, namely the absolute value of the sample and the value of the fed-back mean, the mean-out can increase at a relatively rapid rate when switches 42 and 44 are in the "on" state, but the mean-out would decrease at a relatively small rate when the switches are in the default position.

Operation of the invention of the preferred embodiment will now be described with respect to the figures. An audio signal is presented as an input to the invention (see sample in 12 at input 14 of FIG. 1). Absolute value block 24 finds the absolute value of the input sample 12 and passes it as an input to mean calculator 22 which computes a new mean based on current sample 12 and a current mean value. Divider 20 divides input sample 12 by the new mean generated by 22. The result of divider 20 at output 26 controls the adjusted sample 28.

Mean calculator 22 takes the absolute value of sample 12 as an input and sends it through a gain of ($1-K_1$)(see 50) and a gain of ($1-K_2$)(see 52). The constant $K_1$, is greater than $K_2$ by an amount determined by the specific application.

In the preferred embodiment the amounts $K_1$ and $K_2$ can be determined experimentally. As an example, in the case of the invention being used to remove effects of volume control on a signal, the amounts can be determined by the following types of factors: maximum adjust time from silence to speech; minimum hold time from speech to silence, and likelihood of input signal change in volume.

As can be seen in FIG. 2 the absolute value of sample 12 is also sent to the comparator 64. Additionally, the current mean is fed back to comparator 64. The current mean is also sent through a gain of $K_1$, (see 60) and a gain of $K_2$ (see 62).

If the absolute value of sample 12 is greater the fed-back mean, control 64 has an output which is turned on. On the other hand, if the fed-back mean is greater than the absolute value of sample 12, the output of control 64 is turned off. The output of control 64 controls switches 42 and 44 such that in the default position switches 42 receives input from gain 50 as switch 44 receives input from gain 60. When switches 42 and 44 are on, the input is from gain 52 and gain 62 respectively. Adder 34 adds the output of switches 42 and 44 and sends it to buffer 34. After a delay of one sample, the output of buffer 34 becomes the new mean (mean-out 32) and is fed back to comparator 64 and to gains 60 and 62 for the next sample processing.

Figure 3B:
FIG. 3B is a diagrammatic depiction of the mean of a relatively constant speech envelope produced according to the present invention.

Circuit 10 is an automatic gain control that reacts to an audio signal such as shown in FIG. 3A as follows. After a long period of silence, ending for example at 70 in FIG. 3A, the mean level 80 (see FIG. 3B) has reached is lowest level. As speech starts again (72 in FIG. 3A), AGC circuit 10 adjusts and the mean 82 of FIG. 3B increases rapidly. As the first syllable of speech 73 ends (see 74 of FIG. 3A) the means starts to slowly decrease (see 84 in FIG. 3B). With the start of another syllable 75 (see reference numeral 76 for the increasing part of the level of syllable 75), AGC circuit 10 increases the mean again rapidly (see 86 of FIG. 3B) which increases the gain rapidly.

This process continues until after the last syllable 77. After the last syllable 77, even though the audio signal (FIG. 3A at reference numeral 78) is at a very low amplitude, circuit 10 decreases the mean slowly (see 88 in FIG. 3B). It can be seen, however, that the overall modified mean (FIG. 3B) during syllables 73, 75, and 77, and during the times in-between syllables see 74 and 79 of FIG. 3A, is as close to constant as is needed. Thus, by applying the mean shown in FIG. 3B in circuit 10, over the entire speech communication portion of audio signal of FIG. 3A, the speech envelope is maintained at a relatively constant level. Even once speech stops (see 78 of FIG. 3A), the speech envelope slowly declines (see 88 of FIG. 3B). If speech does not restart, the mean would slowly decline to its level 80 in FIG. 3B. Circuit 10 would then wait and if speech begins again, it would rapidly rise in the same manner as described.

Figure 4:
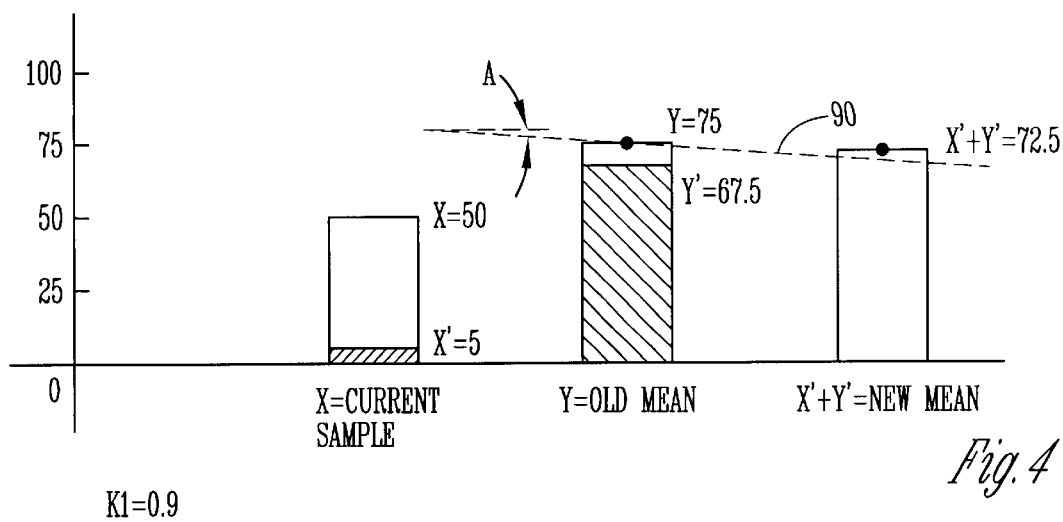
FIG. 4 is a graph illustrating by a simplified example the mean output of FIG. 2 when the absolute value of the input sample is less than the prior mean for the system.

To further assist in an understanding of the operation of a preferred embodiment, please refer to FIGS. 4–8. It is to be understood, however, that the examples given in FIGS. 4–8 are not preferred or necessarily ever desired as far as the values are concerned. The values of the coefficients have been selected in order to illustrate graphically how the invention operates. It would be difficult to show the concepts of the invention otherwise. FIG. 4 illustrates that in a situation where the current mean Y is at a relative level of 75 (see the vertical axis of FIG. 4), and the received absolute value of sample 12 is at the relative value of 50 (see X in FIG. 4), comparator 64 would not turn on because the state X>Y is not met. Switches 42 and 44 would stay in the default position shown in FIG. 2. Assuming in FIG. 4 that the coefficient $K_1$ is selected to be 0.9, and further assuming $K_2$ is selected to be 0.1 (the condition $K_1$ is greater than $K_2$ being met), the situation of FIG. 4 would result in X, the current input sample 12, being amplified by 1–$K_1$ or 1–0.9= 0.1) and feedback mean Y being amplified $K_1$ which is 0.9. As shown in FIG. 4, the amplified value of X would be 5 (now referred to as X' in FIG. 4) and the amplified value of Y, referred to as Y', is 67.5. X' and Y' are computed by multiplying X by 0.1 and Y by 0.9 respectively. As will be appreciated, in practice, a 0.1 value for $K_2$ is much too small. It is normally at least on the order of 0.8, and more likely higher. A value of 0.1 is most times like having no AGC at all. The same is true even at levels on the order of 0.5. Typical values will be 0.96 and 0.98; or 0.95 and 0.99; or 0.90 and 0.95.

Adder 36 would then add X' and Y' to create the sum 5+67.5=72.5. As shown by line 90 in FIG. 4, the old mean Y is therefore manipulated to become new mean X'+Y', which is essentially 2.5 values less than its original value 75 and the value of the previous mean relative to the new mean decreases only slightly (see small slope of line 9 in FIG. 4).

Therefore, in FIG. 1, the new mean, 72.5, would become rationed with the current sample (by division), and the current sample adjusted by the ratio.

Figure 5:
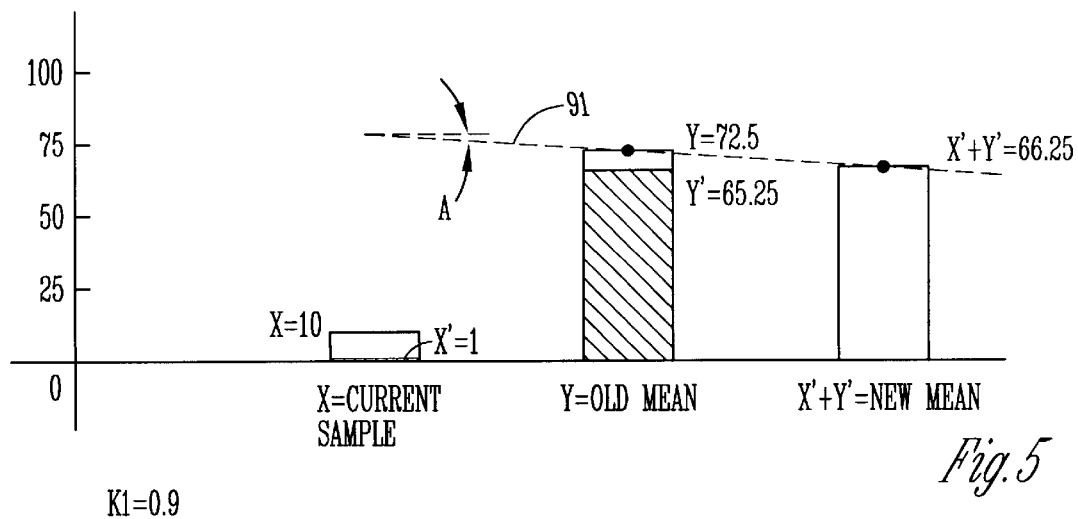
FIG. 5 is similar to FIG. 4, but showing the mean output of FIG. 2, based on the mean output of FIG. 4, when the sample input continues to decrease.

FIG. 5 is similar to FIG. 4, but illustrates a next sample X that continues to decrease in level and continues to be lower than the newly calculated mean. In FIG. 5 the newly calculated mean of FIG. 4 at a relative value of 72.5 (now the "old mean") is operated upon by amplification at level $K_1$. The new current sample X is operated upon by the amplification value 1–$K_1$. FIG. 5 shows that the new mean X' Y' decreases approximately six values to 66.25 even though the sample reduced by 40 values. The decrease in mean 32 continues to be relatively small (see line 91 in FIG. 5).

Figure 6:
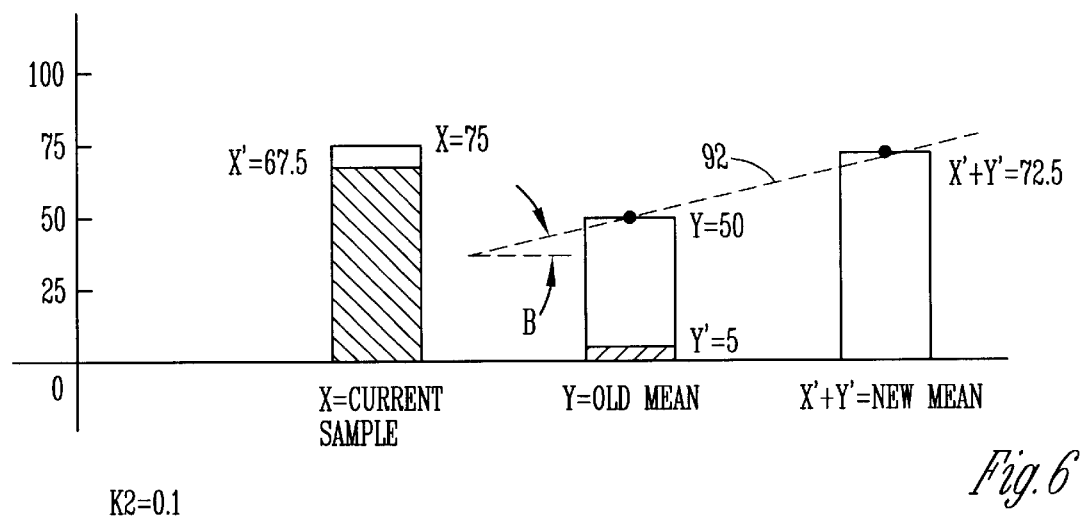
FIG. 6 is similar to FIGS. 4 and 5, but shows the mean output of FIG. 2 when the input sample is larger than the previous mean.
Figure 7:
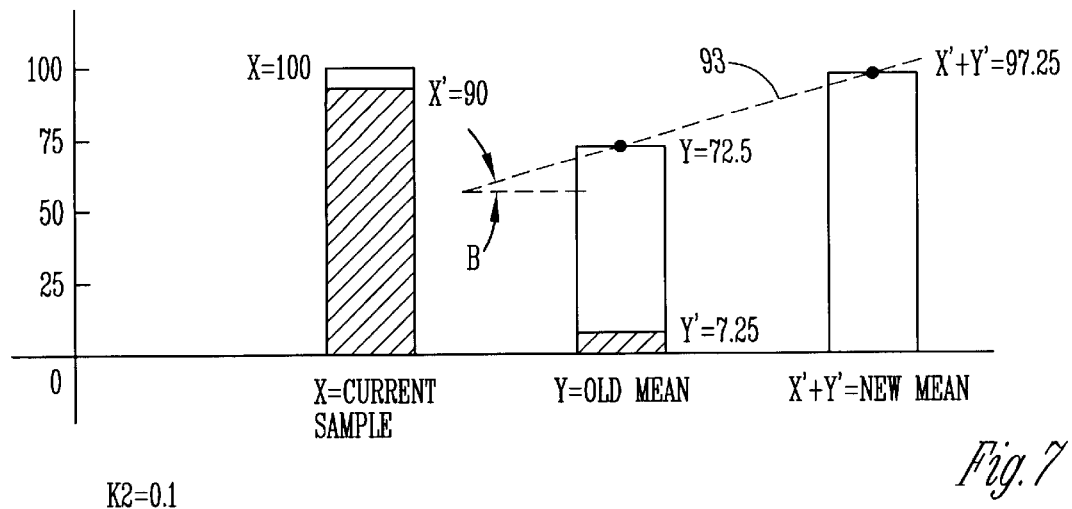
FIG. 7 is similar to FIG. 6, but shows the mean output of FIG. 2 when the sample continues to increase from that of FIG. 6.

In comparison, FIGS. 6 and 7 show how mean-out 32 would increase at a high level if the input sample absolute value exceeds the most recent mean. In this situation the state X>Y is met (see FIG. 6 where X=75 and Y=50). Switches 42 and 44 would change to their "on" position. The absolute value of sample 12 would be operated upon by gain value 1–$K_2$. In this example 1–$K_2$ is selected to be 0.1 as previously mentioned. Thus, 1–$K_2$ would equal 1–0.1=0.9. Additionally, the fedback former mean would be operated upon by value $K_2$ which in this example is 0.1. As shown in FIG. 6, 0.9 of X is 67.5 and 0.1 of Y is 5. These values are indicated at X' and Y'. Adder 36 would add those values to obtain the new mean value of 72.5. It can therefore be seen that the old mean was 50, but the new mean rises immediately by over 22 values to 72.5. The slope of line 92 in FIG. 6 is much greater than slope 90 in FIG. 4 or slope 91 in FIG. 5.

FIG. 7 shows that if the mean-out 32 of FIG. 2 is then used for the next audio sample, its value would be 72.5 (see Y in FIG. 7). If the new sample continues to increase from that in FIG. 6 (here X=100 compared to X=75 of FIG. 6), the state X>Y remains, the switches would again be in the "on" position and the new sample value absolute value X would be amplified 1–$K_2$. The mean calculated in FIG. 6 would be amplified by the value $K_2$. FIG. 7 shows that 0.9 or 90% of X would be 90 and 1% of Y would be 7.25. The sum of those two values in adder 36 would be 97.25. Line 93 shows again a significant increase from the last mean value of 72.5 to the new mean value of 97.25. The new mean value closely approaches the actual value 100 of the input, and therefore circuit 10 has quickly brought the mean up near the actual value of the input. On the other hand, again compare FIGS. 4 and 5, which show that the previous mean decreases slowly relative to the large difference to the mean and the actual input, as well as the large difference in the rate of decrease of the input relative to the decrease of the mean.

Figure 8:
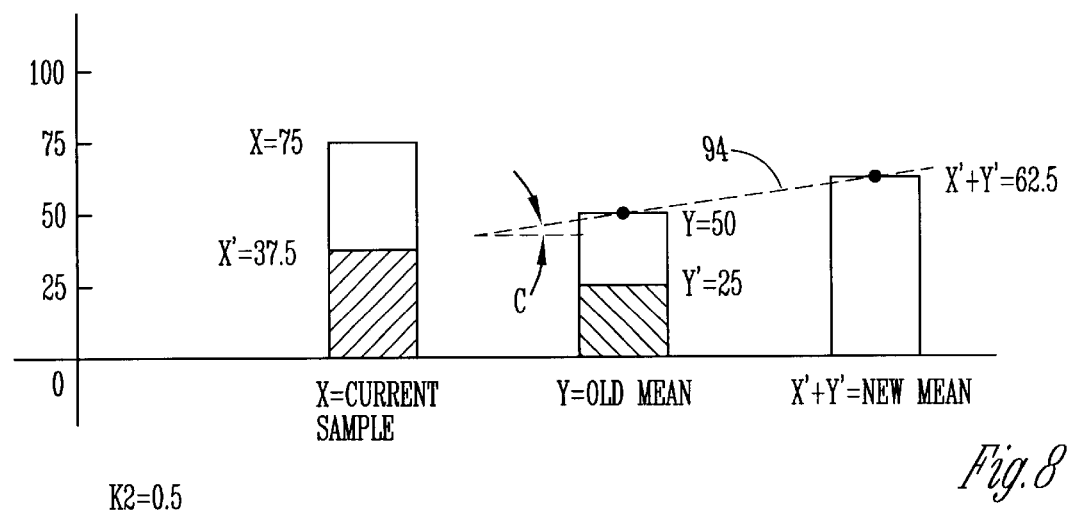
FIG. 8 is similar to FIGS. 4–7, but shows the mean output of FIG. 2 when the sample input is greater than the previous mean, but where the coefficient of application for the mean generator is selected to be a different value than that of FIGS. 6 and 7.

FIG. 8 simply shows that, in comparison to FIG. 6, if $K_2$ is selected to be 0.5 instead of 0.1, it still is lower than $K_1$ (in this example 0.9) and still has the effect of substantially increasing the mean upon the circuit seeing an input signal greater than the mean (see line 94 in FIG. 8).

The present invention can take many forms and embodiments. The preferred embodiment described herein is not by way of limitation, but by way of example only. Variations obvious to those skilled in the art will be included within the scope of the invention.

For example, the circuits of FIGS. 1 and 2 can be implemented in software in a digital signal processor. The audio samples can be digitally quantified and then manipulated accordingly. Components known in the art could then convert the adjusted sample back into an audio form for utilization.

The values $K_1$ and $K_2$ are adjustable and selectable according to need. If desired, $K_1$ and $K_2$ could vary only slightly and still provide a variable coefficient automatic gain control.

Filtering can be added between elements 24 and 22 of FIG. 1 to further customize performance. There could also be more than two states. For example, instead of simply monitoring for whether the sample is greater or less than the mean, the monitoring of more states, and a corresponding gain signal adjustment as desired could be made for each state. For example, the following four states could exist: sample>>mean; sample>mean; sample<mean; and sample<<mean.

There are different ways to compute each new mean. What is called the block method saves N samples and averages the samples. Each time a new sample is retrieved, it is put into the N samples while the oldest one is removed. There is essentially a buffer of past samples, which are averaged and then weighted according to the method described herein. This takes a small amount of computing and N words of RAM.

Another method is an "exponential" method which requires less RAM than the block method. It needs one piece of RAM for the mean. It takes the magnitude of the current sample and adds it to a running total. Then, the new mean is calculate as shown below:

mean=mean*coeff+current sample*(1–coeff)

When the current sample is less than the mean, then weight the mean high, for example:

Mean coeff=0.999977, x(n) coeff=0.000023 (should sum to 1)

This means that little change occurs to the gain so it takes many seconds to start amplifying the noise too high. Now, if the current sample is greater than the mean, the gain is lowered much faster, for example:

mean coeff=0.93, x(n) coeff=0.07 where the level is quickly (e.g. 5 to 20 ms) moved to where it needs to be.

As mentioned, it is to be understood that the preferred embodiment always weights its gain signal adjustment most heavily to the mean. It is how much weighting towards the mean, is what is at issue.

What is claimed:

1. A method for maintaining a constant speech envelope using automatic gain control comprising:

sampling actual audio signal amplitudes;

computing a running mean on each sample by weighting a previous mean, weighting a current sample and adding the weighted previous mean and weighted current sample;

using the running mean to alter the current sample;

selecting the weighting by comparing the amplitude of the current sample with the value of the previous mean;

if the amplitude of the current sample is larger than the value of the previous mean, weighting the previous mean and current sample more heavily towards the current sample;

if the amplitude value of the current sample is smaller than the value of the previous mean, weighting the previous mean and current sample more heavily towards the previous mean;

so that an indication of an increasing signal relative to previous mean results in an automatic gain control level that more rapidly follows the actual signal and an indication of decreasing signal relative to previous mean results in an automatic gain control level that more slowly follows the actual signal.

2. The method of claim 1 further comprising taking the absolute value of each sampled amplitude.

3. The method of claim 2 wherein the absolute value is shaped or filtered.

4. The method of claim 1 wherein the gain increase of the first amount is weighted by a first weighting value in favor of a mean value of samples of the audio signal as compared to recent actual sample amplitude and the gain decrease of the second amount is weighted by a second weighting value in favor of the mean value of samples of the audio signal, but the second weighting value is more in favor of the mean value of samples then the first weighting value.

5. The method of claim 4 wherein weighting occurs by applying a first gain to a current sample value and a second gain to the previous mean; the first gain being defined by the relationship y=1−x, where y is the first gain and x is the the second gain; then adding the current sample value and the previous mean as modified by the first and second gains.

6. The method of claim 5 wherein the first gain is characterized by 1−K, where K is a coefficient.

7. The method of claim 6 wherein the value of K for increasing input signals is $K_1$ and the value for decreasing signals is $K_2$ and $K_1$ is greater than $K_2$.

8. The method of claim 7 wherein the values $K_1$ and $K_2$ are selected at desired values for different applications.

9. An apparatus for maintaining a constant speech envelope of an analog signal using variable coefficient automatic gain control (AGC) comprising:

an input for samples of the analog signal;

a component to measure the absolute value of the samples;

a mean generator for calculating the mean of absolute values of samples;

the mean generator including a component to compute a running mean on each sample by weighting a previous mean, weighting a current sample and adding the weighted previous mean and weighted current sample, a comparator to select the weighting by comparing the amplitude of the current sample with the value of the previous mean and generating a weighting signal; if the amplitude of the current sample is larger than the value of the previous mean, the component weighting the previous mean and current sample more heavily towards the current sample; if the amplitude value of the current sample is smaller than the value of the previous mean, the component weighting the previous mean and current sample more heavily towards the previous mean; so that an indication of an increasing signal relative to previous mean results in an automatic gain control level that more rapidly follows the actual signal and an indication of decreasing signal relative to previous mean results in an automatic gain control level that more slowly follows the actual signal;

an output for adjusted samples.

10. The apparatus of claim 9 wherein the mean generator comprises:

a buffer having a mean-out output;

an adder having an output communicated to the buffer;

an input to the mean generator creating an absolute value of an input sample;

first and second inputs to a first switch, the inputs receiving the absolute values of a sample amplified by $1-K_1$ and $1-K_2$ respectively;

first and second inputs to a second switch, the inputs receiving a feedback of the mean-out from the buffer amplified by $K_1$ and $K_2$ respectively, wherein $K_1$ is greater than $K_2$;

a switch control controlling default and on states of the first and second switches;

when in a default state, the output of the first and second switches sending to the adder the absolute value of the input sample amplified by $1-K_1$ and feedback mean-out amplified by $K_1$ respectively;

when the switches are on, the output sending to the adder the absolute value of the sample amplified by $1-K_2$ and the feedback mean-out amplified by $K_2$ respectively.

11. The apparatus of claim 10 wherein when the switches are in the default state the output of the adder generates a value that is weighted more heavily towards the value of the previous mean-out.

12. The apparatus of claim 10 wherein when the switches are in the "on" state, the output of the adder generates a value that is weighted less heavily towards the value of the previous mean out.

* * * * *